United States Patent [19]

Sugimori et al.

[11] Patent Number: 4,748,624
[45] Date of Patent: May 31, 1988

[54] SYSTEM FOR DETERMINING OCCURRENCE SEQUENCE OF SAMPLED DATA

[75] Inventors: Masayasu Sugimori; Kenji Terada, both of Tokyo, Japan

[73] Assignee: Ando Electric Co., Ltd., Tokyo, Japan

[21] Appl. No.: 875,805

[22] Filed: Jun. 18, 1986

[30] Foreign Application Priority Data

Jun. 21, 1985 [JP] Japan .............................. 60-135634

[51] Int. Cl.⁴ ............................................ G06F 15/20
[52] U.S. Cl. ..................................... 371/15; 364/480;
364/900; 371/29
[58] Field of Search ........................... 371/15, 29, 20;
364/900, 480, 481; 324/73 R, 73 AT

[56] References Cited

U.S. PATENT DOCUMENTS

| | | | |
|---|---|---|---|
| 4,334,308 | 6/1982 | Thinschmidt et al. | 371/29 |
| 4,381,563 | 4/1983 | Groom, Jr. et al. | 371/29 |
| 4,493,044 | 1/1985 | Hoeren et al. | 364/579 |
| 4,550,387 | 10/1985 | Takita | 364/900 |
| 4,558,422 | 12/1985 | Den Beste et al. | 364/480 |
| 4,574,354 | 3/1986 | Mihalik et al. | 364/481 |
| 4,608,652 | 8/1986 | Yokokawa et al. | 364/521 |
| 4,611,281 | 9/1986 | Suko et al. | 371/16 |
| 4,623,984 | 11/1986 | Yokokawa et al. | 364/900 |
| 4,654,848 | 3/1987 | Noguchi | 371/20 |

Primary Examiner—Charles E. Atkinson
Attorney, Agent, or Firm—Panitch, Schwarze, Jacobs and Nadel

[57] ABSTRACT

In a logic analyzer including first and second sampling channels operative with different clocks independently, a system for determining sequence in time in which the sampled data are generated in both sampling channels includes a memory interposed between the first and second sampling channels. The memory has a data input supplied with the address data of the first sampling channel, an address input supplied with the address data of the second sampling channel and a data write input supplied with the clock signal of the second sampling channel.

4 Claims, 1 Drawing Sheet

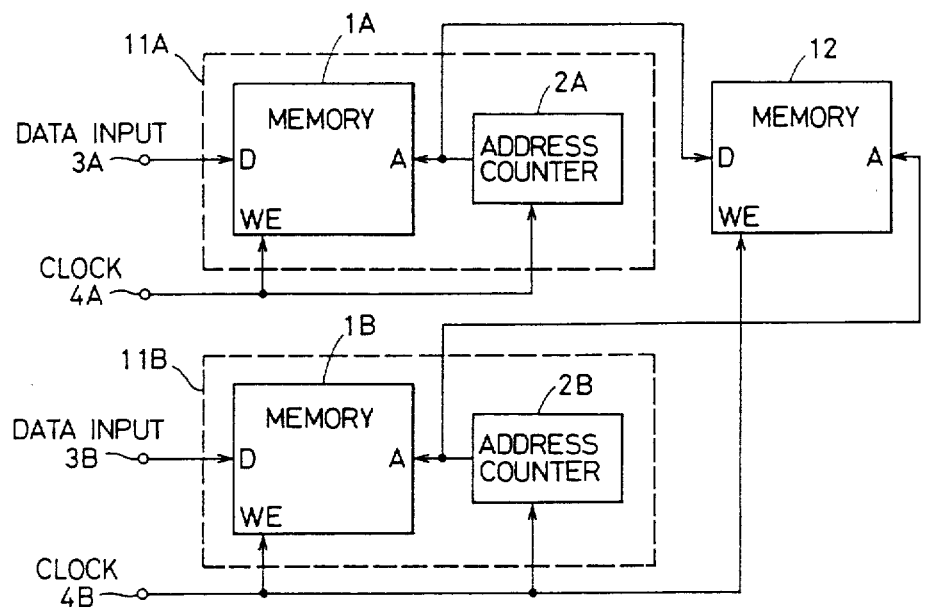

SYSTEM FOR DETERMINING OCCURRENCE SEQUENCE OF SAMPLED DATA

BACKGROUND OF THE INVENTION

1. Field of the Invention

The present invention generally relates to a logic analyzer including two independent sampling channels operative with respective different clocks. More particularly, the invention concerns a system for determining the sequence in time in which data are sampled and held in both sampling channels so that the sequence in concern can be displayed.

2. Description of the Prior Art

The logic analyzer is a sort of measuring instrument for sampling input data with a clock signal of a predetermined sampling frequency and displaying the sampled data in the form of waveform, list or the like.

Recently, there has been developed a logic analyzer which incorporates a plurality of sampling channels which operate independent of one another with respective clock signals of different frequencies. In the logic analyzer of this type, the sequence in time in which the data is sampled in each sampling channel can be easily determined. However, difficulty is encountered in determining the overall sequence of the sampled data among the plurality of sampling channels.

SUMMARY OF THE INVENTION

An object of the present invention is to provide a logic analyzer incorporating first and second sampling channels operative with different clocks independent of each other, in which the sequence in time of data sampled in both channels can be determined.

In view of the above object, there is provided according to an aspect of the invention a system for determining the sequence in which sampled data are generated in first and second sampling channels, which system comprises a memory having a data input supplied with address data of the first sampling channel, an address input supplied with address data of the second sampling channel and a write signal input supplied with the clock signal of the second sampling channel, wherein the memory address of the first sampling channel is sampled simultaneously with the data sampling performed by the second sampling channel.

The above and other objects, features and advantages of the invention will be more apparent upon consideration of the following detailed description of the preferred embodiment. The description makes reference to the accompanying drawings.

BRIEF DESCRIPTION OF THE DRAWINGS

FIG. 1 is a block diagram showing a general arrangement of the system according to an exemplary embodiment of the present invention;

FIG. 2 is a view for illustrating contents in a memory (12) shown in FIG. 1; and FIG. 3 is a view for illustrating a sequence in time of data sampled and held.

DESCRIPTION OF THE PREFERRED EMBODIMENTS

Referring to FIG. 1 which shows in a block diagram a general arrangement of a sampling system according to an embodiment of the invention, broken line blocks 11A and 11B represent sampling channels, respectively, and a reference numeral 12 denotes a memory.

The sampling channel 11A includes a memory 1A and an address counter 2A, while the sampling channel 11B includes a memory 1B and an address counter 2B. The sampling channel 11A has a data input terminal 3A and a clock input terminal 4A. The sampling channel 11B has a data input terminal 3B and a clock input terminal 4B. The input terminals 3A and 3B receive digital signals transmitted from probes, respectively. Hereinafter, these input signals are also denoted by reference letters 3A and 3B while the clock signals applied to the respective terminals are also denoted by 4A and 4B.

In FIG. 1, symbols D, A and WE attached to the memory block 1A represent, respectively, a data input terminal, an address input terminal and a memory write signal input terminal. Further, these symbols are also used for designating the data, address and memory write signal, respectively. Some denotation applies to the memories 1B and 12.

In FIG. 1, the input data (digital signal) 3A is applied to the data input terminal of the memory 1A, and the count output of the address counter 2A is coupled to the address input A of the memory 1A. On the other hand, the clock signal 4A is applied to both the write signal input terminal WE of the memory 1A and the count clock input terminal of the address counter 2A.

Similarly, in the channel 11B, the input data signal 3B is supplied to the data input D of the memory 1B, and the count output of the address counter 2B is coupled to the address input terminal A of the memory 1B. The clock signal 4B is applied to both the write signal input WE of the memory 1B and the count clock terminal of the address counter 2B.

In response to the clock signal 4A applied to the sampling channel 11A, the input data 3A is stored in the memory 1A at an address designated by the count output of the address counter 2A. At the same time, the address counter 2A is incremented so that the updated count content thereof indicates a next address of the memory 1A where a succeeding data signal 3A is to be stored.

In a similar manner, the sampling channel 11B responds to the application of the clock signal 4B to allow the input data 3B to be written in the memory 1B at an address designated by the address counter 2B. Simultaneously, the address counter 2B is incremented so that the updated count thereof indicates a next address of the memory 1B where succeeding data is to be stored.

In this manner, the sampling channels 11A and 11B perform respective sampling operations independent of each other in response to the respective clock signals 4A and 4B which also differ from each other.

According to the teaching of the invention, the memory 12 is interposed between the sampling channel 11A and the sampling channel 11B. The data input D of the memory 12 is supplied with the count output of the address counter 2A belonging to the sampling channel 11A, while the address input A of the memory 12 is supplied with the count output of the address counter 2B belonging to the sampling channel 11B. The write signal input WE of the memory 12 is supplied with the clock signal 4B for the sampling channel 11B.

With the circuit arrangement described above, when the clock signal 4B is applied to the sampling channel 11B, the input data 3B is stored in the memory 1B of the sampling channel 11B in response to the clock 4B, while the memory address of the sampling channel 11A at that time point is stored in the memory 12.

Assuming, by way of example, that the contents of the memory 12 are such as shown in FIG. 2 after completion of a sampling operation, it will be seen that the sequential relation of the stored data between the sampling channels 11A and 11B are such as shown FIG. 3. It will be noted that FIG. 2 shows the addresses of the memory 12 in combination with data stored at the corresponding addresses.

The present invention brings about advantages mentioned below:

(a) By sampling bus data of a microprocessor with the sampling channel 11A while sampling the signal of a peripheral hardware with the sampling channel 11B, sequential relationship in time between the operations of software and the hardware can be straightforwardly checked. Thus, failure involving both software and hardware can be effectively traced.

(b) By tracing a first microprocessor with the sampling channel 11A while tracing a second microprocessor with the sampling channel 11B, it is possible to examine a multi-CPU system analytically.

What is claimed is:

1. In a logic analyzer including first and second sampling channels operative with different clocks, a system for determining the sequence in which sampled data are generated in said channels, comprising:

a first memory having a data input supplied with address data of said first sampling channel, an address input supplied with address data of said second sampling channel and a write signal input supplied with the clock signal of said second sampling channel;

wherein the memory address of said first sampling channel is sampled simultaneously with the data sampling performed by said second sampling channel.

2. A system according to claim 1, wherein each of said first and second sampling channel includes a data input for receiving data, a memory and an address counter operative in response to the associated clock signal, wherein a count output of the address counter of said first channel is connected to the data input of said first memory, a count output of the address counter of said second channel is connected to the address input of said first memory, and the clock signal of said second channel is applied to the signal write input of said first memory.

3. A system according to claim 2, wherein said first sampling channel is destined to sample bus information of a microprocessor, while said second sampling channel is destined to sample a signal of a peripheral hardware.

4. A system according to claim 2, wherein said first sampling channel is associated with a first microprocessor of a multi-CPU system with said second sampling channel being associated with a second microprocessor of said multi-CPU system.

* * * * *